INVENTOR:
Eduardo T. Ulzurrun
By Louis A. Kline
John J. Matlago
Nathan Cass
His Attorneys INVENTOR:
Eduardo T. Ulzurrun
By Louis A. Kline
John J. Matlago
Nathan Cass
His Attorneys United States Patent Office 3,169,229
Patented Feb. 9, 1965

3,169,229
AGC SYSTEM INCORPORATING CONTROLLABLE SEMICONDUCTOR SHUNT-TYPE ATTENUATOR

Eduardo T. Ulzurrun, Hollywood, Calif., assignor to The National Cash Register Company, Dayton, Ohio, a corporation of Maryland Filed Aug. 18, 1961, Ser. No. 132,389
14 Claims. (Cl. 330—24)

This invention relates generally to means and methods for employing semiconductor elements for use in controlling the flow of electrical signals. More particularly, this invention relates to a novel controllable semiconductor impedance device whose transfer impedance is variable in accordance with a control signal.

The use of semiconductor elements, such as transistors and diodes, in a wide variety of electronic applications has increased enormously in recent years, chiefly because of the very low power requirements and extremely small size of semiconductor elements which make them highly advantageous for use in many applications, particularly in microminiaturized assemblies.

In accordance with the present invention, it is an object to extend the advantages of using semiconductor elements to a relatively simple novel type of controllable semiconductor impedance device whose transfer impedance may conveniently be varied in accordance with a control signal.

Another object of the present invention is to provide a controllable semiconductor impedance device which produces a minimum of insertion loss for low amplitude signals passed therethrough.

A further object of the present invention is to provide a controllable impedance device which causes negligible distortion of an information signal passed therethrough.

Still another object of the present invention is to provide a controllable semiconductor impedance device which is operable over an extremely wide frequency band.

Yet another object of the present invention is to provide an improved automatic gain control system which incorporates the novel controllable semiconductor device of the foregoing object.

A further object of the present invention is to provide an automatic gain control system employing controllable semiconductor impedance means which is capable of controlling an electrical signal containing intelligence information so as to maintain the average peak-to-peak value thereof substantially equal to a reference level for a wide range of input signal values.

An additional object of this invention is to provide the devices of the foregoing objects in relatively simple, compact and inexpensive form.

In a typical embodiment of a controllable semiconductor impedance device in accordance with the invention, two germanium diodes are connected in series in a like-poled direction and are further connected in series with the emitter-base diode of a PNP transistor, the three series-connected diodes then being connected across a bias voltage source which causes a first forward bias current to flow therethrough. A point intermediate the two germanium diodes then serves as a node to which a second bias current is fed along with a control current and a signal current. The two bias currents are chosen to provide an operating point for the circuit so that the non-linear characteristics of the diodes result in a transfer impedance being presented to the signal current which varies in accordance with the control current, an output current thereby being produced in the collector of the transistor which is a function of the control current applied to the device. This controllable semiconductor impedance device is then incorporated in an automatic gain control loop to provide a novel automatic gain control system which, in the typical embodiment to be described herein, is constructed and arranged to maintain the average peak-to-peak value of an electrical signal containing intelligence information substantially equal to a reference voltage for a wide range of input signal amplitudes and frequencies, while at the same time introducing negligible distortion into the output signal.

The specific nature of the invention as well as other objects, uses, and advantages thereof will become apparent to those skilled in the art as disclosure is made in the following detailed description of a typical embodiment of the invention illustrated in the accompanying drawings in which.

Like numerals designate like elements throughout the figures of the drawings.

In order to permit the various features of the invention to be clearly understood, the invention will first be described in general form to provide a background for the specific description of the invention following thereafter.

Figure 1:
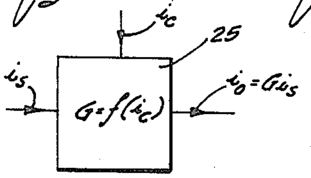
FIG. 1 is a basic block diagram of a controllable semiconductor impedance device in accordance with the invention.

Referring first to FIG. 1, a basic block 25 is shown representing a controllable semiconductor impedance device in acordance with the invention having an instantaneous transfer conductance G which is a function of a control signals $i_c$ applied thereto, that is, $G=f(i_c)$. The transfer conductance G is, of course, the reciprocal of transfer-resistance. Since an input signal $i_s$ applied to the device 25 will produce an output signal $i_0$ represented by the equation $i_0=Gi_s=f(i_c)i_s$, the output signal $i_0$ will be a function of both the signal $i_s$ and the control current $i_c$.

Figure 2:
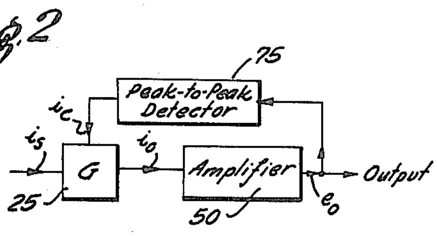
FIG. 2 is a block diagram illustrating the manner in which a controllable semiconductor impedance device is incorporated in an automatic gain control system in accordance with the invention.

While such a controllable impedance device 25 as basically illustrated in FIG. 1 may be employed for various purposes, a particularly advantageous use of the device is in an automatic gain control system, such as illustrated in FIG. 2. As there is shown, the output signal $i_0$ from the device 25 is fed to an amplifier 50, whose output $e_0$ is in turn fed to a peak-to-peak detector 75. The purpose of the peak-to-peak detector 75 is, first, to detect the average peak-to-peak value of the signal $e_0$ applied thereto, which is, in effect, a measure of the peak-to-peak value of the input signal $i_s$, and then to provide a control current $i_c$ for the controllable impedance device 25 which is related to the algebraic difference between the average peak-to-peak value of signal $e_0$ and a reference level. The reference level is chosen equal to the desired value at which the average peak-to-peak value of signal $e_0$ is to be maintained, regardless of the average peak-to-peak value of input signal $i_s$.

The control signal $i_c$ provided by peak-to-peak detector 75, therefore, has a magnitude and polarity which is directly related to the difference between the average peak-to-peak value of signal $e_o$ and the desired reference level. The controllable impedance device 25 is constructed and arranged for use in the automatic gain control system of FIG. 2 so that this control current $i_c$ applied thereto acts to vary the transfer conductance G of device 25 by an amount and in a direction which causes the average peak-to-peak value of signal $e_o$ to be forced toward the desired reference level. For example, if at a given instant the average peak-to-peak value of $e_o$ becomes greater than the reference level, peak-to-peak detector 75 produces a control signal $i_c$ which acts to reduce the transfer conductance G of controllable impedance device 25 and in turn reduce the value of signal $i_o$ by an amount which, as a result of regenerative feedback, will return the average peak-to-peak value of signal $e_o$ to the desired reference level. Of course, the gain of the feedback loop in FIG. 2 must be sufficient to maintain the average peak-to-peak value of output signal $e_o$ substantially at the reference voltage level for the range of variations in the input signal $i_s$ which are to be handled by the automatic gain control system.

Figure 3:
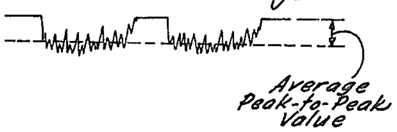
FIG. 3 illustrates the waveform of a typical signal which may be applied to the automatic gain control device of FIG. 2.

A typical waveform of an input signal $i_s$ which may be applied to the automatic gain control system of FIG. 2 is illustrated in FIG. 3. This waveform represents the signal obtained, for example, from an optical scanner of a character recognition system, such as is generally described in my copending patent application Serial No. 128,086, filed July 31, 1961, for Signal Information Detection Circuitry. Automatic gain control is important for a signal such as shown in FIG. 3 in order to permit the character recognition system to be used for reading characters which may be printed on paper stocks having a wide range of optical reflectivity as well as to compensate for variations in the photosensitive pick-up means which may be employed in the system. However, conventional automatic gain control means must be quite complex to operate satisfactorily with the character recognition signal of FIG. 3 since the peak-to-peak value of the signal not only varies over a considerable amplitude range but, in addition, the signal contains a wide range of frequency components which must remain undistorted in order to permit accurate detection of character information signals contained therein.

In accordance with the present invention, as will hereinafter become evident, the controllable impedance device 25 of FIG. 1, although remarkably simple, is able to operate over the range of amplitudes and frequencies contained in an input signal $i_s$, such as shown in FIG. 3, without distortion and with a minimum of insertion loss. As a result, by incorporating the controllable impedance device 25 in an automatic gain control system, as shown in FIG. 2, a novel and most simple automatic gain control system is achieved which completely solves the problem of providing automatic gain control for an input signal having a wide range of amplitudes and frequencies, such as illustrated in FIG. 3.

With the above general description of the invention as background, specific preferred embodiments of the controllable impedance device 25 and the peak-to-peak detector 75 of FIG. 2 will now be described to permit a clearer understanding of how the advantages of the present invention are achieved. The amplifier 50 of FIG. 2, however, will not be considered in further detail, since those skilled in the art will readily be able to provide a suitable amplifier 50 having the required gain and frequency response for operation in the automatic gain control system of FIG. 2.

Figure 4:
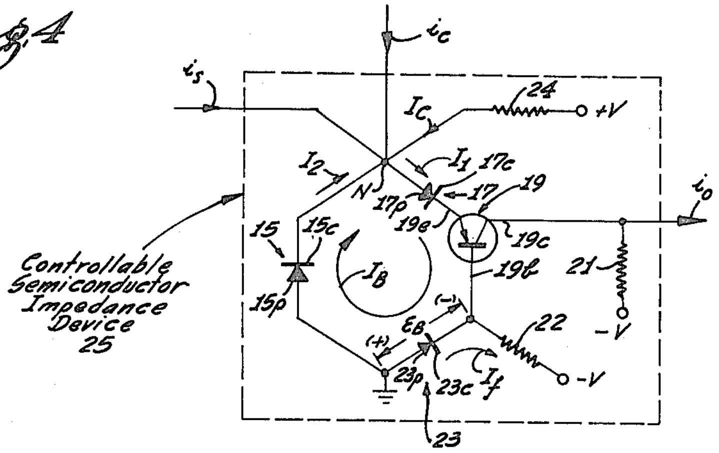
FIG. 4 is a circuit diagram of an embodiment of a controllable semiconductor impedance device in accordance with the invention.

Referring first to FIG. 4, a circuit diagram is shown of a typical embodiment of a controllable semiconductor impedance device 25 in accordance with the invention. It will be seen from FIG. 4 that the device 25 basically comprises two like-poled series connected diodes 15 and 17 which are further connected in series with the emitter-base diode of the emitter 19*e* and the base 19*b* of the PNP transistor 19, the three series diodes then being connected across a bias voltage source $E_B$ which provides a forward bias current $I_B$ flowing therethrough. More specifically, the plate 15*p* of diode 15 is connected to circuit ground, which is the more positive side of the voltage source $E_B$, and the cathode 15*c* of diode 15 is connected to the plate 17*p* of diode 17, whose cathode 17*c* is in turn connected to the emitter 19*e* of transistor 19. Diodes 15 and 17 as well as transistor 19 may be of the germanium type. The base 19*b* of transistor 19 is returned to the other or more negative side of voltage source $E_B$, and the collector 19*c* of transistor 19 is connected through a collector resistor 21 to a negative collector voltage source −V.

The bias voltage source $E_B$ is conveniently provided in the controllable semiconductor impedance device of FIG. 4 as the voltage drop $E_B$ across a diode 23, having its plate 23*p* connected to circuit ground and its cathode 23*c* connected to the base 19*b* of transistor 19. The diode 23 is biased in the forward direction by a bias current $I_f$ supplied to the junction between the cathode 23*c* of diode 23 and the base 19*b* of transistor 19 from a voltage source −V by way of bias resistor 22.

The junction between the cathode 15*c* of diode 15 and the plate 17*p* of diode 17 in FIG. 4 is now made to serve as a node N to which the input current $i_s$ and the control current $i_c$ shown in FIGS. 1 and 2 are fed along with a second bias current $I_C$ supplied by a positive voltage source +V through a resistor 24. The effect of applying these currents $i_s$, $i_c$ and $I_C$ to the node N and the overall operation of the controllable impedance device 25 of FIG. 4 in producing output current $i_o$ will now be explained with reference to the graphs of FIGS. 5A and 5B.

Figure 5A:
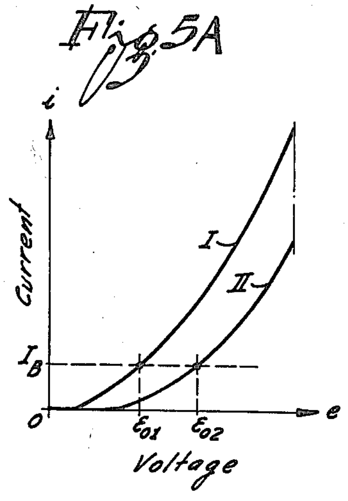
FIGS. 5A and 5B are graphs illustrating typical current vs. voltage characteristics for the semiconductor components of the embodiment of FIG. 4.

Referring initially to FIG. 5A, there are shown two current vs. voltage curves designated as I and II, the curve I representing a typical current vs. voltage characteristic of the branch in FIG. 4 containing diode 15 (which will hereinafter be referred to as Branch I), while the curve II represents a typical combined current vs. voltage characteristic for the branch containing diode 17 in series with the emitter-base diode of transistor 19 (which will hereinafter be referred to as Branch II). The slope at each point of the curves I and II in FIG. 5A represents the A.-C. resistance, or the reciprocal of the A.-C. conductance, of its corresponding branch.

Figure 5B:
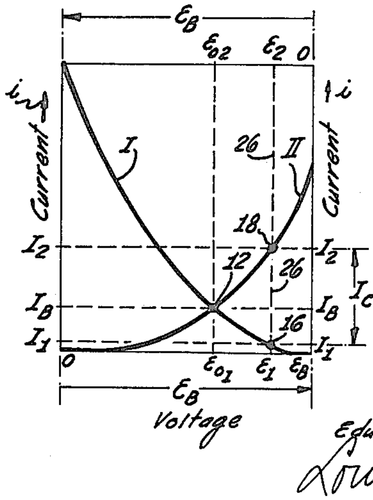

Since the sum of the voltages appearing across Branches I and II is necessarily equal to the bias voltage $E_B$, the two curves shown in FIG. 5A may conveniently be drawn in back-to-back fashion with curve I reversed as shown in FIG. 5B to better illustrate the operation of the circuit of FIG. 4. Assuming for the present that no currents are applied to node N, that is, $i_s$, $i_c$, and $I_C$ are all zero, then the bias current $I_B$ flowing in both Branches I and II wil be equal. This situation is illustrated in FIG. 5B at the intersection point 12 between curves I and II, which is the point where $I_B$ is the same for both branches, the sum of the respective voltages $Eo_1$ and $Eo_2$ appearing across Branches I and II at intersection point 12 being equal to $E_B$.

The second bias current $I_C$ is now fed to node N in order to establish a desired operating point for the circuit of FIG. 4. It will be understood that the second bias current $I_C$ applied in the direction shown causes an increased current flow in Branch II and thus an increased voltage drop thereacross, while branch I suffers a decreased current flow and thus a decreased voltage drop thereacross. While the currents in the two branches are no longer equal, the sum of the voltage drops thereacross is necessarily still equal to $E_B$. The new operating point for the circuit of FIG. 4 as a result of the application of the second bias current $I_C$ may therefore be indicated as shown by the dashed vertical line 26 in FIG. 5B. At this operating point Branch I rests at point 16 with a current $I_1$ and a voltage drop $E_1$, while Branch II rests at point 18 with a current $I_2$ and a voltage drop $E_2$. The sum of voltage drops $E_1$ and $E_2$ is, of course, equal to $E_B$ and the relationship of the currents may be expressed as $I_2=I_C+I_1$ or $I_C=I_2-I_1$.

Now considering the operation of the circuit of FIG. 4, it will be understood that the value of the output current $i_o$ is dependent upon the proportion of the input current $i_s$ which reaches Branch II and is thus applied between the emitter 19*e* and base 19*b* of transistor 19 to produce the output current $i_o$ from collector 19*c*. The proportion of the input current $i_s$ reaching Branch II is in turn dependent upon the transfer impedance of the circuit which, as will be seen from FIG. 5B, will vary as $i_c$ is varied about the operating point established by $I_C$. More specifically, if the A.-C. conductance of Branch I in FIG. 4 is designated as $G_1$ and the A.-C. conductance of Branch II is designated as $G_2$, then the transfer conductance G provided by the two branches will be $G_2/G_1+G_2$ and the A.-C. output current $i_o$ may then be designated as $i_o=Gi_s=TG_2/G_1+G_2$ where T is a constant whose value is dependent upon the current gain provided by transistor 19.

Referring to FIG. 5B, the A.-C. conductances $G_1$ and $G_2$ of Branches I and II are represented by the slope at each point of their respective curves I and II. The choice of the value of $I_C$, which determines the operating point of the circuit, thus effectively determines the initial values of $G_1$ and $G_2$ when the control current $i_c=0$. It will now be understood that the effect of the control current $i_c$ is to shift operation either to the left or to the right of the circuit operating point indicated by the dashed line 26 in FIG. 5B depending upon the magnitude and direction of $i_c$. Since a shift in either direction will cause the slope of one curve to increase while the slope of the other curve decreases, the values of $G_1$ and $G_2$ (which are equal to the reciprocal of their slopes at each point of their respective curves) will vary correspondingly to cause a different value of transfer impedance G to be obtained for each value of $i_c$.

For example, if a particular control current $i_c$ is applied to node N in the direction indicated in FIG. 4 so as to add to $I_C$, operation in FIG. 5B will be shifted to the right by an amount dependent upon the value of $i_c$, causing the slope of curve II to increase while the slope of curve I decreases. Thus, conductance $G_1$ will increase while conductance $G_2$ decreases and the transfer conductance G will be reduced accordingly. Alternatively, if the control current $i_c$ applied to node N is in a direction opposite to the direction indicated in FIG. 4 so as to oppose $I_C$, operation in FIG. 5B will be shifted to the left by an amount dependent upon the value of $i_c$. The slope of curve I will now be increased while the slope of curve II will be decreased, causing $G_2$ to increase while $G_1$ decreases, thereby producing an increased transfer conductance G.

It should now be evident that the controllable semiconductor device 25 of FIG. 4 is capable of providing a transfer conductance G which may conveniently be varied in accordance with a control current $i_c$. The particular transfer conductance G vs. control current $i_c$ characteristic of the circuit of FIG. 4 is, of course, dependent upon the value of the bias voltage $E_B$ and the particular operating point provided by the second bias current $I_C$, as well as by the current vs. voltage characteristics of the semiconductors. In the above discussion it has been assumed that the D.-C. levels of currents $i_s$ and $i_c$ are zero, but if not, the bias current $I_C$ can be adjusted to compensate for D.-C. levels in either or both of the currents $i_c$ or $i_s$.

Having generally described the circuit of FIG. 4, a discussion of some of its features and various design considerations will now follow. It will first be noted that the only frequency-sensitive elements involved in the circuit of FIG. 4 are the semiconductor elements themselves, that is, diodes 15, 17, and 23 and transistor 19. Thus, the frequency response of the circuit is determined primarily by the frequency characteristics of these elements, which ordinarily remain relatively constant over a wide frequency range.

Next, it will be appreciated that in order to prevent distortion, the input signal $i_s$, although having a wide range of signal amplitudes, should preferably have amplitudes which are sufficiently small so that semiconductors in FIG. 4 may be considered as operating within an essentially linear region. For this reason, the input signal $i_s$ is preferably fed to the controllable impedance device 25 in the automatic gain control system of FIG. 2 before amplification by amplifier 50.

Another consideration which may be involved is related to the choice of the operating point as determined by bias voltage $E_B$ and bias current $I_C$. These should preferably be chosen in conjunction with the expected amplitudes of the input signal $i_s$ and the control signal $i_c$ so that an operating region is chosen which will produce a minimum of distortion of the input signal $i_s$. Of course, the types of semiconductor elements employed can be chosen to give the most desirable operational characteristics. For example, two diodes in series or parallel could be provided instead of a single diode in order to obtain a particular current vs. voltage characteristic. Also, one or more resistors or other non-linear elements could be provided in one or both of Branches I and II to provide a more favorable characteristic. Such modifications are obviously within the scope of the present invention.

Another consideration of the circuit of FIG. 4 is with regard to the operation of transistor 19. It will be appreciated that the voltage source −V and the collector resistor 21 are suitably chosen to provide the desired D.-C. operating conditions for the transistor 19 so as to permit the transistor 19 to operate over the range required to product an output current $i_o$ which is an accurate representation of the input current $i_s$.

Figures 6, 7, 8:
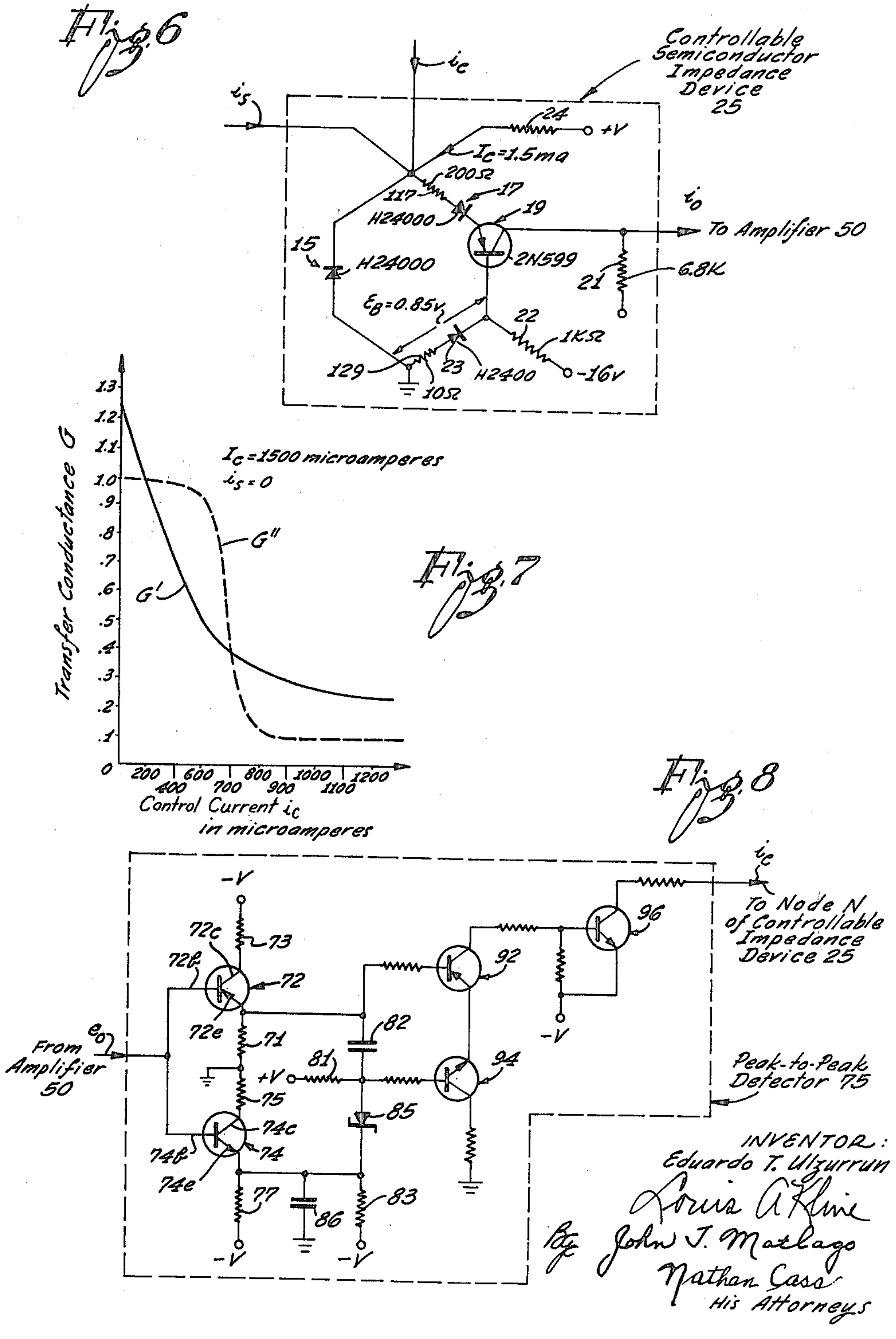
FIG. 6 is a circuit diagram of a specific illustrative embodiment of a controllable semiconductor impedance device in accordance with the invention.
FIG. 7 is a graph illustrating the transfer conductance vs. control current characteristic of the specific circuit of FIG. 6.
FIG. 8 is a circuit diagram of a preferred embodiment of the peak-to-peak detector of FIG. 2.

In order to illustrate the design of a typical controllable semiconductor impedance in accordance with the invention, a specific embodiment of the circuit of FIG. 4 is shown in FIG 6. It is to be understood that the values and types of components shown in FIG. 6 are presented merely for illustrative purposes and are not to be considered as limiting the invention in any way. It will be noted that the only difference between the circuit of FIG. 6 and that shown in FIG. 4 is the addition of resistor 117 in series with diode 17 and the addition of resistor 129 in series with diode 23. Resistor 129 is provided to achieve a higher bias voltage $E_B$ than could be achieved by using the voltage drop provided by diode 23 alone. Resistor 117, on the other hand, is provided to shape the current vs. voltage characteristic of Branch II and also serves to prevent saturation of transistor 19.

Referring now to FIG. 7, which is a graph illustrating the transfer conductance G vs. control current $i_c$ of the circuit of FIG. 6, solid curve G′ is obtained for the circuit of FIG. 6 as shown, while the dashed curve G″ illustrates the situation where resistor 117 in series with diode 17 is omitted. It will be evident from FIG. 7 that significant curve shaping is possible not only by proper choice of semiconductors, but also, by providing suitable resistors in one or more of the two branches, such as the resistor 117.

Now considering the incorporation of the controllable impedance device 25 in the automatic gain control system of FIG. 2, it is initially important to recognize that it is of considerable advantage to choose the second bias current $I_C$ so that the operating point of the circuit of FIG. 4 is considerably to the right of the intersection point 12, as illustrated by the dashed vertical line 26 in FIG. 5B. By such a choice of a maximum transfer conductance and thus the highest output current $i_o$ is obtained for low amplitude input signals which should be attenuated as little as possible. The operating point of the specific circuit of FIG. 6 has been chosen in this manner with $I_C$=1500 microamperes, as indicated in FIG. 7. As a result, it will be seen from FIG. 7 that the transfer conductance G′ is maximum for $i_c$=0 and decreases as $i_c$ is increased. It will also be seen in FIG. 7 that the provision of the 200 ohms resistor provides curve G′ with a considerable linear operating range so as to permit operation with a minimum of distortion of the input signal $i_s$.

In accordance with the above-described choice of the operating point for the controllable impedance device 25, as just described, the operation of the automatic gain control system of FIG. 2 is adjusted so that the amplifier 50 provides an output signal $e_o$ which is equal to the desired reference level for the minimum average peak-to-peak value expected for the input signal $i_s$. Then, for input signals having average peak-to-peak values greater than the minimum, peak-to- peak detector 75, in response to $e_o$, produces a control current $i_c$ (in a direction opposite to the direction indicated in FIGS. 4 and 6) which opposes the bias current $I_C$ and causes a corresponding reduction in the transfer conductance G of the controllable semiconductor impedance device 25, as illustrated by the typical curve G′ in FIG. 7. As a result of the regenerative feedback action provided by the automatic gain control system of FIG. 2, the average peak-to-peak value of the output signal $e_o$ of amplifier 50 will then be maintained substantially equal to the desired reference level over a wide range of input amplitudes.

Having described the construction and arrangement of a controllable semiconductor impedance device in accordance with the invention and its incorporation in the automatic gain control system of FIG. 2, a preferred embodiment of the peak-to-peak detector 75 generally illustrated in FIG. 2 will now be described in detail with reference to the circuit diagram of FIG. 8.

As shown in FIG. 8, the output signal $e_o$ from amplifier 50 is fed to the bases 72*b* and 74*b* of PNP and NPN transistors 72 and 74, respectively. These transistors 72 and 74 are connected as emitter followers so as to provide a relatively high input impedance for the input signal $e_o$. As so connected, the collector resistors 73 and 75 are chosen relatively small with respect to their emitter resistors 71 and 77, respectively, and are provided chiefly for protective purposes. As shown, collector resistor 73 is connected between collector 72*c* of transistor 72 and negative voltage source −V, while collector resistor 75 is connected between collector 74*c* of transistor 74 and circuit ground. On the other hand, emitter resistor 71 is connected between emitter 72*e* of transistor 72 and circuit ground, while emitter resistor 77 is connected between emitter 74*e* of transistor 74 and voltage source −V.

The outputs at the emitters 72*e* and 74*e* of transistors 72 and 74 in FIG. 8 are now connected so that a first capacitor 86 is connected between emitter 74*e* of transistor 74 and circuit ground, and a second capacitor 82 is connected between emitter 72*e* of transistor 72 and emitter 74*e* of transistor 74 through a zener diode 85. The zener diode 85 is biased on one side by a resistor 81 connected to a positive voltage source +V, and on the other side by a resistor 83 connected to a negative voltage source −V.

It will now be understood that, as a result of the above described connections capacitor 86 will charge through the base 74*b* and emitter 74*e* of transistor 74 to the most positive peak voltage of siganl $e_o$, while capacitor 82 will charge through the base 72*b* and emitter 72*e* of transistor 72 to a voltage equal to the difference between the most negative peak voltage $e_o$ appearing at emitter 72*e* and the sum of the voltages across capacitor 86 and zener diode 85, the charging and discharging circuits of capacitors 82 and 86 being chosen so that the voltages appearing across capacitors 82 and 86 correspond to average values of the signal $e_o$. By choosing the voltage provided by zener diode 85 equal to the desired level of the average peak-to-peak value of signal $e_o$, the voltage appearing across capacitor 82 will then correspond to the difference between the average peak-to-peak voltage of signal $e_o$ and the reference level provided by zener diode 85. The voltage across capacitor 82 thus represents the excess of the average peak-to-peak voltage of signal $e_o$ over the desired reference level. Transistors 92 and 94, to which the voltage across capacitor 82 is fed, then act to convert the voltage across capacitor 82 into a signal at the collector of transistor 92, which is further amplified by transistor 96 to provide the control current $i_c$ which is fed to node N of the controllable impedance device 25, as shown in FIG. 4. It will be evident, that the control current $i_c$ thus obtained represents the excess of the average peak-to-peak value of signal $e_o$ over the reference level set by zener diode 85, and will therefore provide the necessary control of the device 25 for operation of the automatic gain control system of FIG. 2.

It is to be understood in connection with the above description that many modifications and variations in the construction, arrangement, operation and use of the invention are possible without departing from the principles disclosed herein. The present invention, therefore, is to be considered as including all such modifications and variations coming within the scope of the invention as defined in the appended claims.

What is claimed is:

1. A controllable semiconductor impedance device comprising at least two semiconductor diodes having non-linear voltage vs. current characteristics and being connected in series in a like-poled direction so as to form first and second parallel branches, each branch including one diode, means providing a first bias current flowing through said branches to provide a forward bias current for said diodes, means applying a second bias current to a node located between said branches and intermediate the two semiconductor diodes to establish an operating point for said device, said branches being connected so as to provide a return path for currents applied to said node, means for applying a control current to said node to vary the currents flowing in said diodes so as to vary the transfer impedance of said device, means for applying a signal current to said node by way of a path other than through either of said diodes, and means coupled to one of said branches for providing an output signal in response to the proportion of said signal current flowing in one of said diodes, the combined current vs. voltage characteristic of said two branches and said bias currents being chosen so that the transfer impedance of said impedance device varies in a predetermined manner in response to said control current.

2. A controllable semiconductor impedance device comprising at least two semiconductor diodes having non-linear voltage vs. current characteristics and being connected in series in a like-poled direction so as to form first and second parallel branches, each including one diode, means providing a first bias current flowing through said branches to provide a forward bias current for said diodes, means applying a second bias current to a node located between said branches and intermediate the two semiconductor diodes to establish an operating point for said device, said branches being connected so as to provide a return path for currents applied to said node, means applying a control current to said node to increase the current in one diode while decreasing the current in the other diode so as to thereby control the transfer impedance of said device, means applying a signal current to said node, by way of a path other than through either of said diodes, and semiconductor means in one of said branches in series with one of said diodes for providing an output current substantially proportional to the current flowing therein, the combined current vs. voltage characteristic of said two branches and said bias currents being chosen so that the transfer impedance of said impedance device varies in a predetermined manner in response to said control current.

3. A controllable semiconductor impedance device comprising first and second semiconductor diodes having non-linear voltage vs. current characteristics, a transistor having base, emitter, and collector elements, means connecting said diodes and the diode formed by two of the elements of said transistor in series in a like-poled direction, means providing a first forward bias current flowing through said diodes and said two elements of said transistor, means applying a second bias current to a node located intermediate said diodes, means applying a control current to said node to increase the current flowing in one diode while decreasing the current flowing in the other diode and thereby control the transfer impedance of said device, means applying a signal current to said node, and means connecting the other of said transistor elements to provide an output signal related to the current flowing in the two transistor elements in series with said diodes.

4. A controllable semiconductor impedance device comprising first and second semiconductor diodes having non-linear voltage vs. current characteristics, a transistor having base, emitter, and collector elements, a bias voltage source, means connecting said diodes and the diode formed by the base and emitter elements of said transistor in series across said bias voltage source in a like-poled direction so as to provide a forward bias current therethrough, means applying a second bias current to a node located intermediate said diodes, means applying a control current to said node to increase the current flowing in one diode while decreasing the current flowing in the other diode and thereby control the transfer impedance of said device, means applying a signal current to said node, and means connecting the collector of said transistor to provide an output signal related to the current flowing in the emitter-base diode of said transistor.

5. The invention in accordance with claim 1, wherein said second bias current is chosen so that the operating point of said device presents a relatively high transfer conductance to said signal current for zero control current, and a decreasing transfer conductance as the control current is increased in a predetermined direction.

6. The invention in accordance with claim 5, wherein a resistor is inserted in series with one of said diodes to shape the transfer conductance vs. control current characteristic of said device.

7. A controllable semiconductor impedance device comprising first and second semiconductor diodes having non-linear voltage vs. current characteristics, a transistor having base, emitter, and collector elements, a bias voltage source including a third semiconductor diode connected so that current from said source biases said third diode in a forward direction, means connecting said first and second diodes and the diode formed by the base and emitter elements of said transistor in series across said bias voltage source in a like-poled direction so as to provide a forward bias current therethrough, means applying a second bias current to a node located intermediate said diodes, means applying a control current to said node to increase the current flowing in one diode while decreasing the current flowing in the other diode so as to thereby control the transfer impedance of said device, means applying a signal current to said node, and means connecting the collector of said transistor to provide an output signal related to the current flowing in the emitter-base diode of said transistor.

8. A controllable semiconductor impedance device comprising first and second branches each including at least one semiconductive element having a non-linear current vs. voltage characteristic, means providing a first bias current flowing through said branches for biasing said semiconductive elements in a forward direction, means applying a second bias current to a junction point between said branches, means applying a control current to said junction point, means applying a signal current to said junction point, and semiconductive means in one of said branches for providing an output current related to the current flowing therein, the combined current vs. voltage characteristic of said two branches and said bias currents being chosen so that the transfer impedance of said impedance device varies in a predetermined manner in response to said control current.

9. In an automatic gain control system, a controllable semiconductor impedance device to which an input signal is applied, an amplifier to which the output of said impedance device is fed, and a detector for detecting the peak-to-peak value of the signal at the output of said amplifier and for applying a control current to said impedance device which control current is related to said peak-to-peak value, said controllable semiconductor impedance device including at least two forwardly biased diodes connected in series in a like-poled direction and having non-linear voltage vs. current characteristics, said diodes being connected so as to form first and second parallel branches each including at least one of said diodes with a junction point being provided between said branches and a return path being provided from said branches for currents applied to said junction point, means applying said control current to said junction point, means applying said input signal to said junction point by a path other than through either of said diodes, and semiconductive means in one of said branches for providing an output from said controllable semiconductor impedance device which is related to the current flowing in said one of said branches, the transfer conductance vs. control current characteristic of said impedance device being chosen in conjunction with the gain of said amplifier so that the peak-to-peak value of the signal at the output of said amplifier is maintained substantially constant for a wide range of input signal amplitudes.

10. In an automatic gain control system, a controllable semiconductor impedance device including at least two forwardly biased diodes connected in series in a like-poled direction and having non-linear voltage vs. current characteristics and connected so as to form first and second parallel branches each including at least one of said diodes with a junction point being provided between said branches and a return path being provided from said branches for currents applied to said junction point, the combined current vs. voltage characteristic of said branches determining the transfer impedance of said device, means applying an input signal to be controlled to said junction point of said device by a path other than through either of said diodes, an amplifier to which the output of said impedance device is fed, and a detector for detecting the peak-to-peak value of the signal at the output of said amplifier and for applying a control current to said impedance device at said junction point which control current is related to the difference between said peak-to-peak value and a reference level, said controllable impedance device being constructed and arranged so that the transfer impedance thereof varies in response to said control current in a manner so as to provide an output from said controllable semiconductor impedance device which will compensate for variations in the peak-to-peak value of said input signal.

11. In an automatic gain control system, a controllable semiconductor impedance device to which an input signal current is applied, an amplifier to which the output of said impedance device is fed, and a detector for detecting the peak-to-peak value of the signal at the output of said amplifier and for applying a control current to said impedance device which control current is related to the difference between said peak-to-peak value and a reference level, said controllable semiconductor impedance device comprising at least two semiconductor diodes connected in series in a like-poled direction so as to form first and second parallel branches, each branch including one diode, means providing a first forward bias current for said diodes, means applying a second bias current to a node located between said branches and intermediate the two-semiconductor diodes to establish an operating point for said device, said branches being connected so as to provide a return path for currents applied to said node, means applying said control current to said node, and means applying said input signal current to said node by a path other than through either of said diodes, the combined current vs. voltage characteristic of said diodes and the operating point of said device being chosen in conjunction with the gain of said amplifier and the operating characteristics of said detector so that the transfer impedance of said impedance device varies in response to said control current to provide an output from said controllable semiconductor impedance device which varies in a manner so that the peak-to-peak value of the signal at the output of said amplifier is maintained substantially constant for a wide range of input signal amplitudes.

12. In an automatic gain control system, a controllable semiconductor impedance device to which an input signal current is applied, an amplifier to which the output of said impedance device is fed, and a detector for detecting the peak-to-peak value of the signal at the output of said amplifier and for applying a control current to said impedance device which control current is related to the difference between said peak-to-peak value and a reference level, said controllable semiconductor impedance device comprising first and second semiconductor diodes, a transistor having base, emitter, and collector elements, means connecting said diodes and the diode formed by two of the elements of said transistor in series in a like-poled direction, means providing a first forward bias current flowing through said diodes and said two elements of said transistor, means applying a second bias current to a node located intermediate said diodes, means applying said control current to said node to control the transfer impedance of said impedance device, means applying said input signal current to said node, and means connecting the other of said transistor elements to provide an output signal related to the current flowing in the two transistor elements in series with said diodes, the combined current vs. voltage characteristic of said diodes and said second bias current being chosen in conjunction with the gain of said amplifier and the operating characteristics of said detector so that the transfer impedance of said impedance device varies in response to said control current in a manner so that the peak-to-peak value of the signal at the output of said amplifier is maintained substantially constant for a wide range of input signal amplitudes.

13. The invention in accordance with claim 12, wherein said second bias current is chosen so that the operating point of said impedance device presents a relatively high transfer conductance to said input current for zero control current, and a decreasing transfer conductance as the control current is increased in a predetermined direction.

14. The invention in accordance with claim 13, wherein said peak-to-peak detector includes a first capacitor, means coupled to the output of said amplifier for charging said first capacitor to a voltage equal to one level of the peak-to-peak value of the output signal from said amplifier, a second capacitor, a biased zener diode having a voltage drop substantially equal to said reference level, means connecting one end of said first capacitor to one end of said second capacitor through said zener diode, means also coupled to the output of said amplifier for charging the other end of said second capacitor by a voltage equal to the other level of said peak-to-peak value, the voltage across said second capacitor thereby representing the difference between said peak-to-peak value and the zener voltage drop, and means for deriving said control current in response to the voltage across said second capacitor and for applying said control current to said node of said controllable impedance device.

References Cited in the file of this patent

UNITED STATES PATENTS 2,808,474 Maynard et al. ---------- Oct. 1, 1957